(12) United States Patent
Takushima

(10) Patent No.: US 6,454,159 B1
(45) Date of Patent: Sep. 24, 2002

(54) METHOD FOR FORMING ELECTRICAL CONNECTING STRUCTURE

(75) Inventor: Masanori Takushima, Shiga-Ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/638,145

(22) Filed: Aug. 11, 2000

(30) Foreign Application Priority Data

Aug. 18, 1999 (JP) .......................................... 11-231015

(51) Int. Cl.⁷ .............................................. B23K 31/00
(52) U.S. Cl. ................................... 228/253; 228/248.1
(58) Field of Search ........................... 228/248.1, 248.5, 228/180.22, 254, 253; 438/613, 614; 257/737, 738

(56) References Cited

U.S. PATENT DOCUMENTS

| | | |
|---|---|---|
| 5,233,504 A | 8/1993 | Melton et al. |
| 5,485,949 A * | 1/1996 | Tomura et al. |
| 5,658,827 A | 8/1997 | Aulicino et al. |
| 5,762,258 A | 6/1998 | Le Coz et al. |
| 5,804,248 A | 9/1998 | Hewett |
| 5,950,908 A * | 9/1999 | Fujino et al. |
| 6,025,258 A * | 2/2000 | Ochiai et al. |
| 6,030,889 A | 2/2000 | Aulicino et al. |
| 6,090,301 A * | 7/2000 | Mizukoshi et al. |
| 6,189,771 B1 * | 2/2001 | Maeda et al. |

FOREIGN PATENT DOCUMENTS

| | | |
|---|---|---|
| JP | 64-5039 | 1/1989 |
| JP | PUPA-07183305 | 7/1995 |
| JP | 08-203904 | 8/1996 |
| JP | PUPA08-340001 | 12/1996 |
| JP | PUPA09-36532 | 1/1997 |
| JP | PUPA10-163624 | 6/1998 |
| JP | 10163624 * | 6/1998 |
| JP | PUPA11-145613 | 5/1999 |

* cited by examiner

Primary Examiner—M. Alexandra Elve
Assistant Examiner—Jonathan Johnson
(74) Attorney, Agent, or Firm—Lawrence R. Fraley

(57) ABSTRACT

Recesses are formed in a solder transfer plate and filled with solder. Core bumps of an electronic component are brought into contact with the solder in the recesses, and thereby the metal contained in the solder in the recesses is melted. The electrical connecting structure, on which the core bump is coated with solder, is formed by separating the electronic component from the transfer plate.

9 Claims, 6 Drawing Sheets

METHOD FOR FORMING ELECTRICAL CONNECTING STRUCTURE

FIELD OF THE INVENTION

The present invention relates to a method of forming an electrical connecting structure on an electrode protruding from the surface of an electronic component, e.g., a semiconductor chip.

BACKGROUND OF THE INVENTION

Flip-chip attachment, where the chip's input/output terminals are positioned face down on a substrate, has been widely used to join such chips to various substrates, e.g., a printed circuit board. Utilizing this technique, solder or other metal (e.g., copper) bumps are formed on the chip's input/out terminals to form the electrical connection between the terminals and substrate conductors (e.g., pads).

Because of the recent miniaturization of circuit components (including chips), electrical connecting structures to be formed on the electrodes of an electronic component are getting smaller, and spaced on a narrower pitch (greater density). Such electrical connecting structures may be formed by a transfer method in which solders protrude from the surface of a transfer plate and are transferred to an electronic component. See published Japanese Patent Application No. H01-5039.

A transfer plate can also be used for joining low melting point solder to an electrode pad on a substrate. See U.S. Pat. No. 5,233,504. Another solder plate used to form solder bumps on a substrate is described and illustrated in U.S. Pat. Nos. 5,658,827 and 6,030,889.

Where a single metal bump such as a copper bump is used, solder has been applied to the bump by methods such as plating, vapor evaporation, sputtering deposition or the like. However, such a method requires special equipment and involves several complicated steps, thus necessitating increased production times and costs. The published Japanese Patent Application No. 08-203904 discloses a method for applying solder to a metallic bump by heating a protruding electrode of the core bump and bringing a solder sheet into physical contact with the heated electrodes. In this method, however, it is difficult to keep the amount of solder to be applied to the electrical connecting structure constant, so that unexpected joining between adjacent assemblies may occur. Finally, still further examples of various structures associated with solder formation or transfer are defined in U.S. Pat. Nos. 5,762,258 and 5,804,248.

OBJECTS AND SUMMARY OF THE INVENTION

One object of the present invention is to provide a method for forming an electrical connecting structure on an electronic component at relatively lower costs than many known processes while assuring an effective flip-chip form of attachment of the component.

Another object of the present invention is to provide a method for forming an electrical connecting structure to which a uniform amount of solder is applied even when the solder connections are spaced at a relatively narrow pitch.

A further object of the present invention is to provide a solder transfer plate which is to be used for forming such an electrical connecting structure.

According to one aspect of the invention, there is provided a method for forming an electrical connecting structure on an electronic component comprising the steps of forming a core bump on an electrode of an electronic component, forming at least one recess in a solder transfer plate, filling the recess with solder which contains metal different from the metal forming the core bumps, joining the electronic component to the solder transfer plate so as to bring the core bump into contact with the solder in the recess, and transferring the solder filled in the recess to at least a part of the core bump by separating the electronic component from the solder transfer plate.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that the numerals may be used to indicate like elements from FIG. to FIG.

In the method for forming an electrical connecting structure according to the present invention, core bumps are formed on a plurality of electrodes of an electronic component, while a plurality of recesses are formed in a solder transfer plate. The recesses are filled with solder containing metal which is different from the metal forming the core bumps, and then the component and the plate are joined together so as to bring the core bumps into contact with the solders in the recesses. In this way, at least a part of the core bump is coated with the solder in the recess and the solder in the recess is transferred to the core bump by separating the electronic component from the solder transfer plate. It is preferable that the number and the arrangement of the recesses in the solder transfer plate conform to those of the core bumps on the electronic component. In order to coat at least a part of a core bump with solder filled in a recess, it is necessary to heat the assembly to a temperature sufficient to reflow the solder in the recess but not sufficient to melt the core bump. In the method defined herein for forming an electrical connecting structure according to the present invention, core bumps can be relatively easily coated with solder containing metal different from that of the core bumps. Furthermore, it is also possible in the method of the present invention to coat all the bumps with a substantially equal amount of solder. Further, in the method for forming an electrical connecting structure according to the present invention, the amount of solder to be filled in the recesses can be adjusted by setting the depth of the recess and/or the area of its opening in the transfer plate, so that the amount of solder to be applied to the core bumps can be easily controlled.

Embodiments of the present invention will be described in detail below with reference to the accompanying drawings.

Figure 1A:
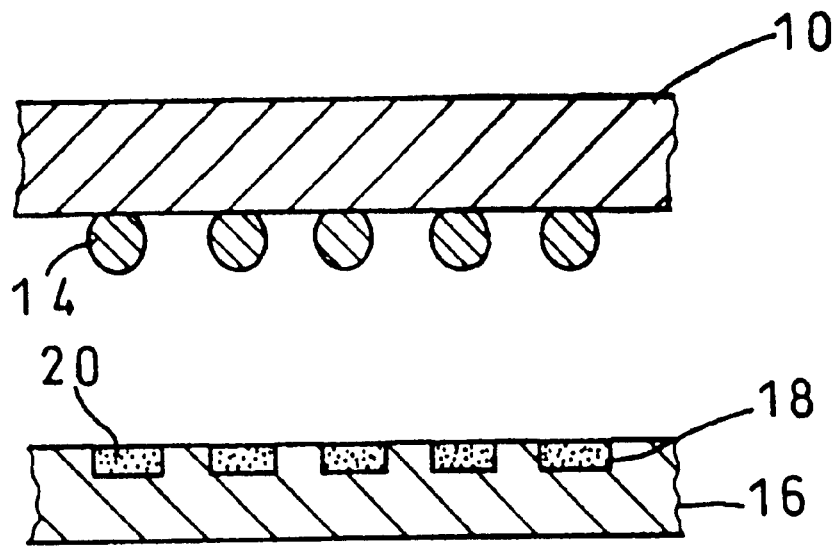
FIGS. 1(a) to 1(c) are cross-sectional views showing a series of steps for forming an electrical connecting structure according to one aspect of the present invention.
Figure 5:
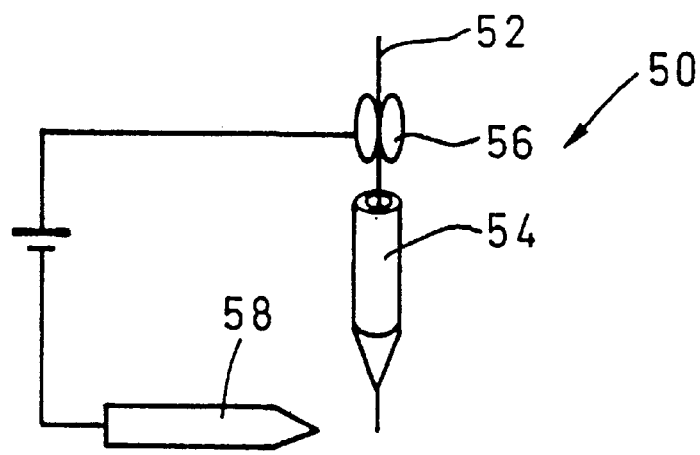
FIG. 5 is a conceptual illustration showing an embodiment of an apparatus for forming core bumps which are used for forming the electrical connecting structure according to the present invention.
Figure 5:
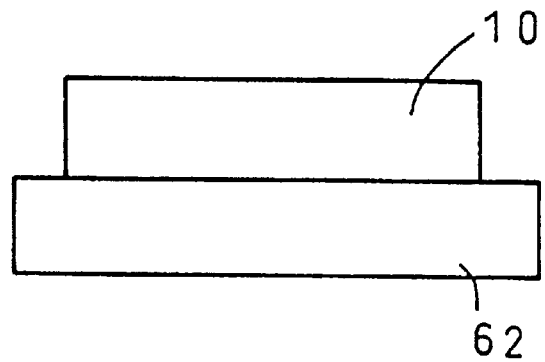

As shown in FIG. 1(a), individual core bumps 14 are projectingly formed in advance on respective electrodes (not shown) connected to the terminals of a semiconductor device (chip) 10, which is just one example of an electrical component on which these connections may be formed. The core bumps 14 can be formed by various methods known to those skilled in the art. Although a method to be employed is not particularly limited, usable methods include, for example, using metallic wires (see below), using vapor deposition, using flux or the like, etc. (In a method using metallic wires, a bump-forming apparatus 50 shown in FIG. 5 is used, which comprises a metallic wire 52, a capillary 54 having a hole in the middle to pass wire 52, a clamper 56 for clamping the wire 52 passed through the hole in capillary 54, a torch 58 for melting the passed wire 52, and a plate 62 for heating the semiconductor chip 10.

Figure 6:
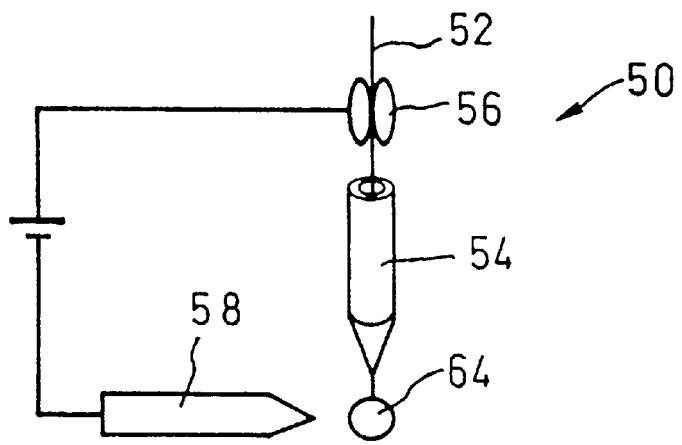
FIG. 6 is a conceptual illustration showing an embodiment of a step for forming core bumps in the process for forming the electrical connecting structure according to the present invention.
Figure 6:
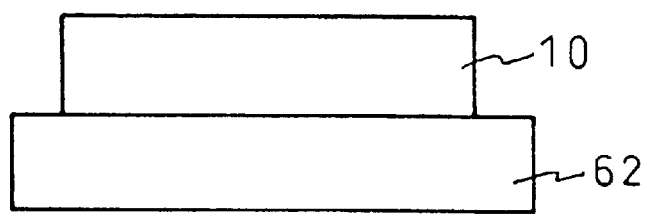

In apparatus 50, a predetermined length of the metallic wire 52 is projected from capillary 54 and heated by torch 58 to form a substantially spherical metal ball 64, as shown in FIG. 6. Then, wire 52 is secured by clamper 56. The electrode, referred to simply as torch 58, is brought near to the tip of the wire 52 and about 1,000 to b 4,000 volts of electrical energy is discharged thereto. Wire 52 is instantaneously melted and the ball formed.

Figure 7:
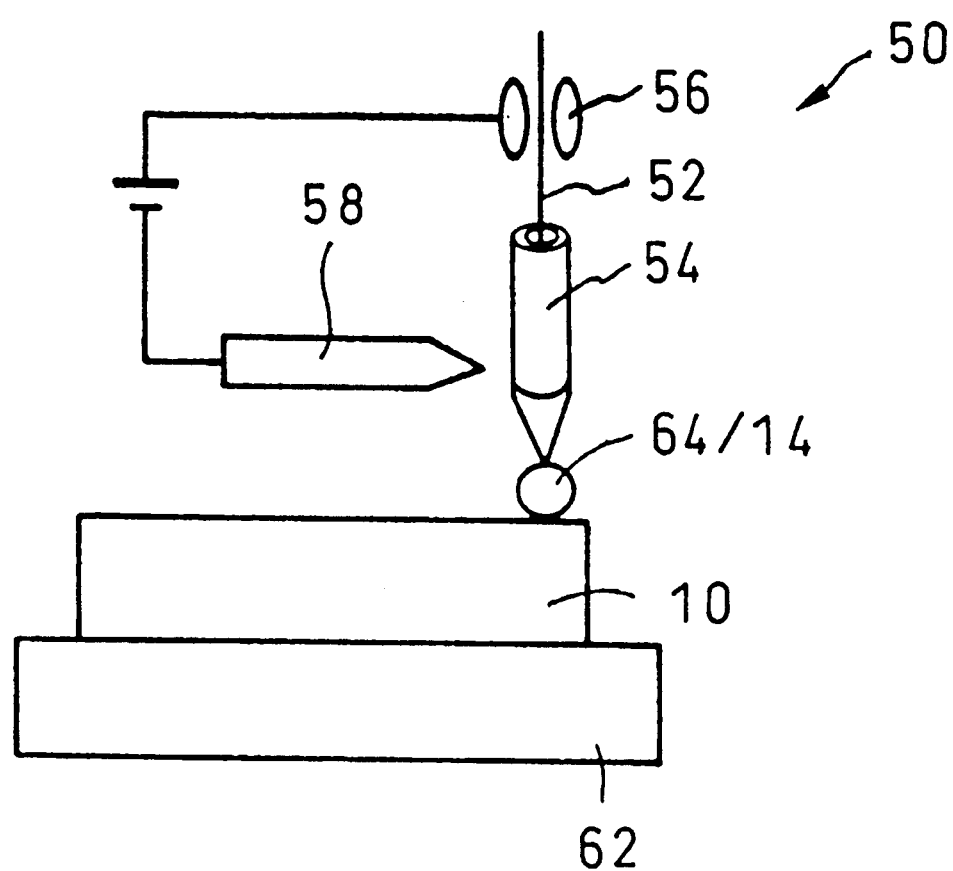
FIG. 7 is a conceptual illustration showing an embodiment of a step for joining core bumps in the process for forming the electrical interconnection assembly according to the present invention.

As shown in FIG. 7, damper 56 is opened after forming ball 64, and the ball and capillary member 54 are then moved together onto a desired electrode (not shown) on semiconductor chip 10. The formed ball is joined to the electrode by the application of pressure, ultrasonic vibration, and heat. At this time, it is preferred that the semiconductor chip is preheated by a plate 62 so as to facilitate ball joining to the electrode. After this step, the metal ball 64 is cut away from wire 52 and thus forms a core bump 14. As seen in FIGS. 1(a)–1(c) and 3, several balls (no. 14 in FIGS. 1(a)–1(c)) are formed on the chip's several electrodes.

Figure 3:
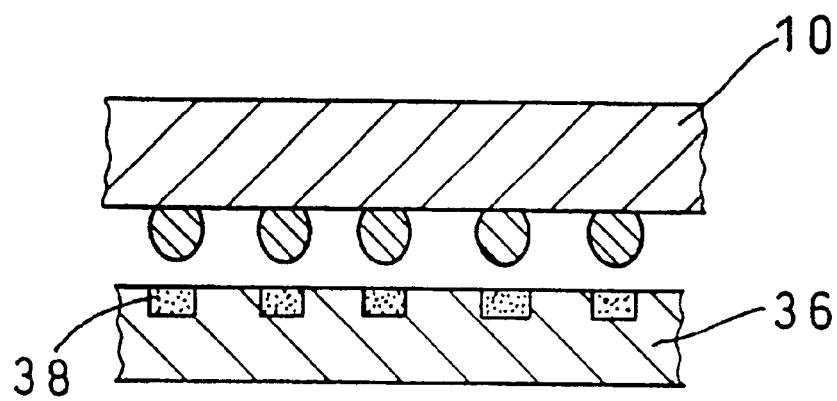
FIG. 3 is a sectional view showing another embodiment of a solder transfer plate and a semiconductor chip, which are used for forming the electrical connecting structure according to one embodiment of the present invention.
Figure 8A:
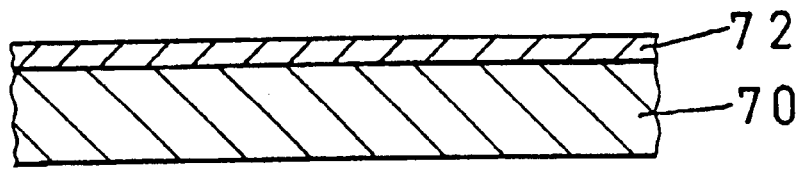
FIGS. 8(a) to 8(e) are illustrations showing a series of steps in a method for forming recesses in a solder transfer plate according to one aspect of the present invention.
Figure 8B:
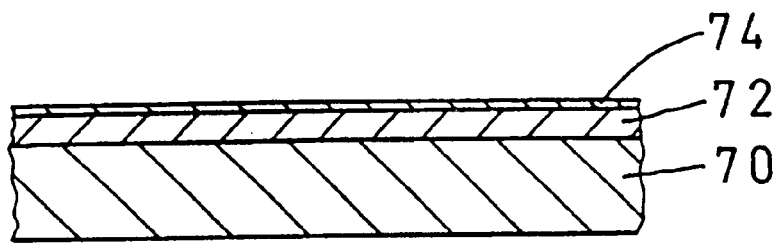
Figure 8C:
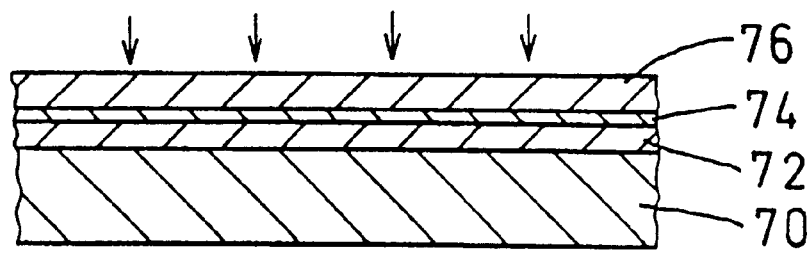
Figure 8D:
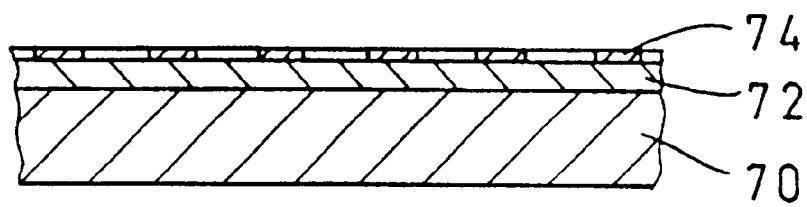
Figure 8E:
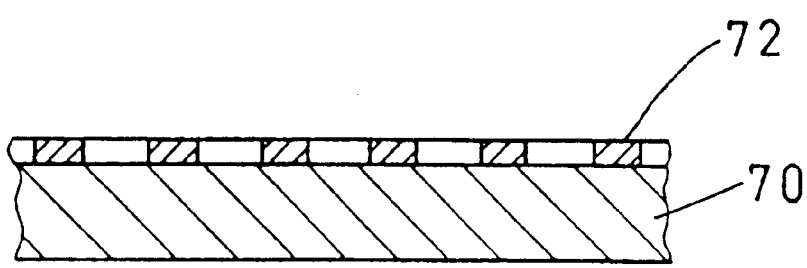
Figure 9A:
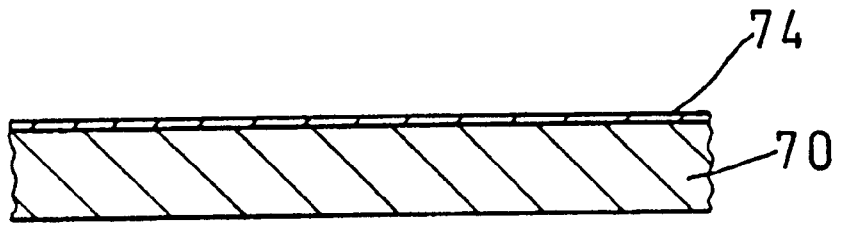
FIGS. 9(a) to 9(d) are illustrations showing a series of steps in another method of forming recesses in a solder transfer plate according to the present invention.
Figure 9B:
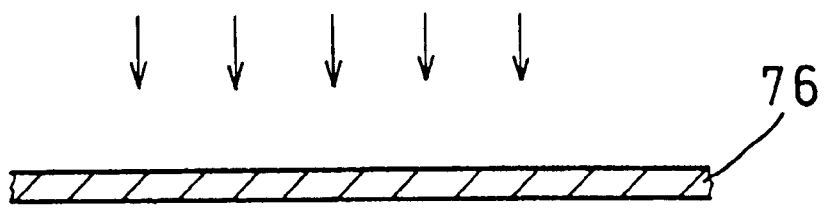
Figure 9C:
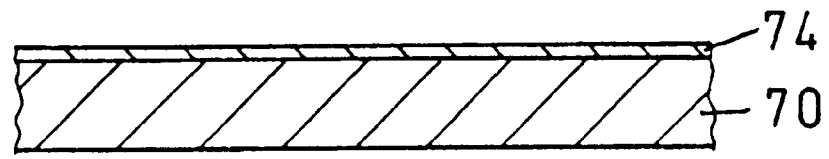
Figure 9C:
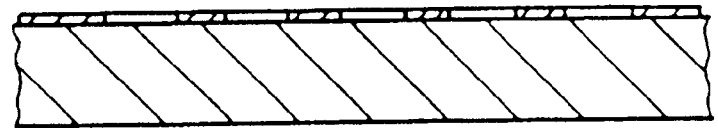
Figure 9D:
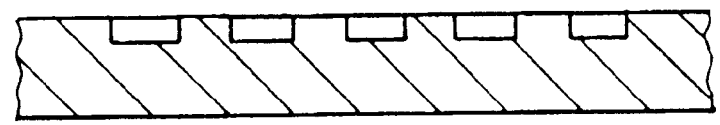

On a solder transfer plate 16 shown in FIG. 1(a), a plurality of recesses 18 are formed which correspond to the respective number of core bumps formed on semiconductor chip 10. A method for forming the recesses 18 is not particularly limited; however, it is preferable to form these using photolithography processing. An example of a method for forming recesses in a solder transfer plate by such a photolithographic technique is shown in FIGS. 8(a) to 8(e). As shown in FIG. 8(a), a solder resist layer 72 is joined to the surface of a glass fiber-reinforced epoxy board 70 with an adhesive agent (not shown). Then, as shown in FIG. 8(b), photo resist is applied to the solder-resist layer 72 and it is thermally cured to form a photoresist layer 74. As shown in FIG. 8(c), a photomask 76 having a shielding portion on a transparent film is placed on the photoresist layer 74, which is subsequently photosensitized and etched (FIG. 8d). Then, the exposed solder resist layer 72 is wet-etched to form recesses 18 (FIGS. 1(a), 1(b) and 38 (FIG. 3). Subsequently, the photoresist layer on these recesses 18 is removed, using another wet-etch procedure. Such a configuration, as now seen in FIG. 8(e), is convenient particularly when the recesses 18 are desired to have a uniform depth. In this method, photomask 76 can be placed at a certain distance from the photoresist layer 74 or directly thereon, as seen in FIG. 8(c). By spacing the mask, patterns on the photomask are optically reduced and reflected to the photoresist layer 74.

The recesses are formed in the solder transfer plate 16 in accordance with the arrangement and size of the core bumps formed on the electrodes of the electronic component (semiconductor chip).

Solder 20, which contains metal different from the metallic material of core bumps 14, is filled in the recesses 18 formed in transfer plate 16, as seen in FIG. 1. The solder 20 used herein may be made of single metal or alloy in powder or paste form, the latter prepared by mixing a metal or metal alloy of specific composition with additives such as flux. In this specification, the solder can be in any form. Examples of a method for filling solder 20 in recesses 18 of solder transfer plate 16 include using a printer such as paste printer; however, the invention is not limited to this method. The solder 20 to be filled in the recesses 18 also contains metal which has a melting point lower than the one forming the core bumps.

Figure 1B:
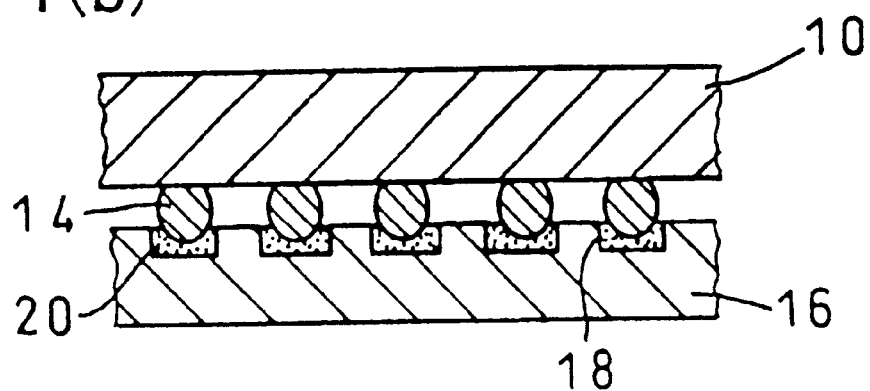

As shown in FIG. 1(b), respective core bumps 14 on chip 10 are brought into contact with the respective quantities of solder in recesses 18 in plate 16. In this case, a highly precise mounting machine is preferably used. Each recess 18 is preferably of a quadrangular prism shape, with its upper opening shaped as a square or rectangle. The area of the opening of each recess 18 is large enough to accommodate the maximum sectional area of the respective core bump 14. The depth of each recess 18, as seen, is not greater than the height of the respective bump. Chip 10 and solder transfer plate 16 are heated at a temperature sufficient to melt the metal particles contained in the solder 20 but not sufficient to melt the metal forming core bump 14. Bump 14 thus retains its original (e.g., spherical) shape during such heating. At this time, at least part of the core bump 14 is covered with solder 20.

Figure 1C:
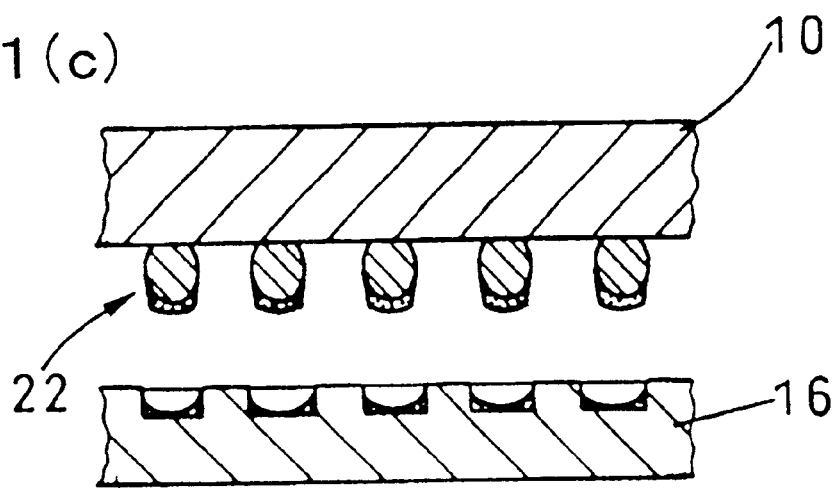

Semiconductor chip 10 and transfer plate 16 are now taken out of the furnace and separated from each other as shown in FIG. 1(c). In this way, the solder 20 is transferred to the bottom portion of core bump 14, and thus a plurality of electrical connecting structures 22, each including a bump 14, coated with solder 20, are obtained. All core bumps 14 are covered with a substantially equal amount of solder 20. At least a part of the bump 14 is always covered with the solder 20, so that bridging, i.e., shorting between adjacent core bumps will not occur. As seen in FIG. 1(c), the solder 20 covers less than one-half of the total surface area of the respective bump.

Solder transfer plate 16 has a different thermal coefficient of expansion (CTE) than semiconductor chip 10. In consideration of this difference, plate 16 should be designed so that the core bumps on the semiconductor chip 10 are precisely assigned with the respective recesses 18 in the plate.

Alternatively, the solder transfer plate can be made of other material having a CTE similar or close to that of the semiconductor chip than, say, a substrate comprising a glass fiber-reinforced epoxy board. When the certain number of core bumps are attached to chip 10 with a predetermined pitch (spacing), the same number of recesses as bumps are formed in the plate in such a way that the pitches between the recesses will be substantially the same as those between the core bumps after being heated.

The metal forming the core bump 14 is not particularly limited; however, it is preferably gold, silver, copper, palladium, white gold, or alloys thereof, or alternatively, an alloy of lead and tin (e.g., 90:10 lead:tin) known as a high melting point solder. The solder in recesses 18 preferably contains indium, tin, lead, antimony, bismuth, and alloys thereof. In any event, the metal which forms the core bump 14 is not particularly limited, as long as it has a melting point higher than that of the recess solder. The metal material of this bump understandably forms the core for the bump, and does not melt or similarly deform during application of solder 20 and also during operation of the resulting electronic component having the electrical connection structure of the instant invention as part thereof.

The metal which forms the solder 20 may be a single metal, but preferably a metal alloy. Examples of metals which are suitable for the solder 20 include binary eutectic solder and ternary eutectic solder. The most preferable metals are lead-tin alloys.

Because the core bumps substantially retain their original shape (e.g., spherical), the spacing between chip and plate is maintained at the predetermined dimension, thereby assuring uniform paste application and reflow.

Preferably, the solder in the recesses of the transfer plate is solder paste, containing flux, so it is preferred to conduct a cleaning step to remove any flux residue.

As is clear from the above, the present invention enables the formation of an electrical connecting structure formed by coating a core bump with solder which contains metal different from that forming the core bump on an electronic component. An embodiment of the method for forming an electrical connecting structure according to the present invention has thus been described, however, the present invention is not limited to the above embodiment. In the following alternative embodiments, like reference characters denote like components, and an explanation will not be given if unnecessary.

Figure 2:
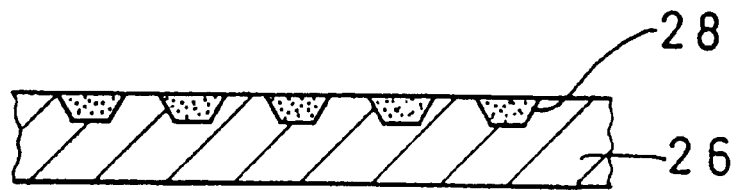
FIG. 2 is a sectional view of an embodiment of a solder transfer plate which is used for forming an electrical connecting structure according to the present invention.

Recesses 28 in transfer plate 26 may be of a downwardly tapered, truncated pyramid shape, as shown in FIG. 2. Alternatively, the recesses can be of an untapered cylinder shape or a downwardly tapered, truncated cone shape.

Figure 4:
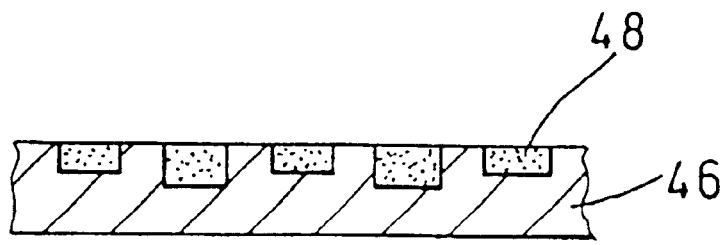
FIG. 4 is a sectional view showing yet another embodiment of a solder transfer plate which is used for forming the electrical connecting structure according to the present invention.

In the present invention, the area and the depth of the recesses in the solder transfer plate may vary. As stated, the area of each recess is preferably larger than the maximum sectional area of each core bump 14, as shown in FIG. 1. However, as shown in FIG. 3, the method for forming an electrical connecting structure according to the present invention can be practiced with a solder transfer plate having recesses with upper openings smaller than the maximum sectional area of the corresponding core bump. That is, the area of the upper opening of each recess is big enough to at least partly insert the respective core bump. The depth of the recesses in the solder transfer plate is not particularly limited, it being equal to or less than the height of the core bump protruding from the surface of the semiconductor chip. For example, where the maximum diameter of the core bump 14 is about 100 microns (about 0.004 inch) and the height of the protruding portion of the bump is about 90 microns, the recess can be so formed that its bottom area is rectangular in shape with approximately 150 micron length, 120 micron width and 25 micron depth dimensions. If it is desired to apply larger amounts of metal to the core bump, these recesses can be formed deeper. On the contrary, if it is desired to apply smaller amount of metal to the core bump, the recess can be formed shallower. It is understood from the drawings that the aforementioned length and width dimensions are those shown from right to left and inwardly from the viewer, respectively. The depth dimension is understandably the distance the recess penetrates into the top surface of plate 36 (the vertical distance). As shown in FIG. 4, the amount of metal to be applied to the core bumps can be adjusted from one core bump to another by adjusting the depth of the recess 48.

The photolithographic method used to form recesses in the transfer plate may be practiced as shown in FIGS. 9(*a*) to 9(*d*). As shown in FIG. 9(*a*), photoresist 74 is applied to the surface of the substrate (e.g., a glass fiber-reinforced board 70) and then cured (for example, thermally cured) to form a photoresist layer 74. Then a photomask 76 (having a shielded portion on a transparent film) is placed over the photoresist 74 with a certain space left between these, as shown in FIG. 9(*b*). The photoresist layer 74 is now photosensitized and etched (FIG. 9(*c*)). In this case, a pattern formed on the photomask is optically reduced and exposed onto the photoresist layer 74. The exposed surface of the glass fiber-reinforced board 70 is wet-etched to form recesses 18 (i.e., as in FIG. 1(*a*)) and the photoresist 74 on the recesses then removed (e.g., wet-etched). The resulting plate is shown in FIG. 9(*d*). In this method, the photomask 76 can also be brought into much closer contact with the photoresist layer. By doing so, the pattern on the photomask may be exposed onto the photoresist layer without being optically reduced.

While the embodiments of the present invention have thus been described with reference to the drawings, it should be understood that the present invention is not limited to the embodiment shown in the drawings. For example, a method for forming core bumps on an electronic component is not limited to a method using metallic wire. The core bumps can be formed by other methods including a vapor deposited method and a direct mounting method. The material for the solder transfer plate is not limited to glass fiber-reinforced epoxy, but can be other material such as ceramic having an excellent heat resistance. In addition, a photosensitive resin sheet can be used as a substitute for photoresist to form a recess in the solder transfer plate. Other modifications are also possible.

As stated, in order to cover a desired part of a core bump with solder from a recess, one can heat the semiconductor chip and the solder transfer plate to a temperature which is lower than a melting point of the core bump and is substantially equal to or greater than the melting point of the recess solder while the core bump on the chip is in contact with the solder in the recesses. It is also possible to heat only the transfer plate (e.g., in a furnace) and then bring the recess solder into contact with the core bump conductors. In these cases, the solder transfer plate is preferably made of material having relatively high heat-resistance.

In the accompanying drawings, one semiconductor chip is correspondingly used with one solder transfer plate. However, in the present invention, a plurality of semiconductor chips can be assigned to a singular solder transfer plate, or one semiconductor chip can even be used with a plurality of solder transfer plates.

Various changes, modifications, and improvements can be made to the embodiments defined herein by those skilled in the art without departing from the scope of the invention as claimed and described. The electrical connecting structure of the present invention can be formed relatively easily and accurately in comparison to many conventional methods. Importantly, the precisely formed solder connections prevent electrical shorts between adjacent connections because of such precise deposition.

What is claimed is:

1. A method of forming an electrical connecting structure on an electronic component, comprising the steps of:

forming at least one core bump of a first metallic material and having a first melting point on an electrode of an electronic component;

providing a solder transfer plate having at least one recess therein;

filling said at least one recess in said solder transfer plate with solder of a second metallic material different from said first metallic material of said at least one core bump and having a second melting point lower than said first melting point;

positioning an electronic component relative to said solder transfer plate so as to at least partly insert said at least one core bump into said solder in said at least one recess;

heating said solder in said at least one recess to cause said solder in said at least one recess to melt and cover less than one-half of the total surface area of said at least one core bump, said at least one core bump not melting as a result of said heating; and separating said electronic component from said solder transfer plate.

2. The method of claim 1, wherein said first and second metallic materials are lead-tin alloys of different compositions.

3. The method of claim 1 wherein said melting of said second metallic material is accomplished by heating said solder transfer plate.

4. The method of claim 3 wherein said solder transfer plate is heated to a temperature which is lower than the melting point of said first metallic material and is equal to or greater than the melting point of said second metallic material.

5. The method of claim 1 wherein, in said step of forming said at least one core bump, said at least one core bump is formed from metallic wire.

6. The method of claim 1 wherein said recess in said solder transfer plate is formed using photolithography.

7. The method of claim 1 wherein said at least one recess has a configuration selected from the group of configurations consisting of a quadrangular prism, a cylinder, and a downwardly tapered, truncated cone.

8. The method of claim 1 wherein said recess has a depth which is less than the height of said at least one core bump.

9. The method of claim 1 wherein said at least one recess has a width which is greater than the diameter of said at least one core bump.

* * * * *